United States Patent [19]

Westgate

[11] Patent Number: 4,691,380
[45] Date of Patent: Sep. 1, 1987

[54] QUAD-RIDGE WAVEGUIDE MIXER

[75] Inventor: Wayne F. Westgate, Sunnyvale, Calif.

[73] Assignee: Avantek, Inc., Santa Clara, Calif.

[21] Appl. No.: 859,617

[22] Filed: May 5, 1986

[51] Int. Cl.$^4$ .............................................. H04B 1/26
[52] U.S. Cl. .................................. 455/328; 455/326; 455/330; 332/43 B
[58] Field of Search ............... 455/326, 328, 330, 332, 455/118; 332/43 B

[56] References Cited

U.S. PATENT DOCUMENTS

| | | | |
|---|---|---|---|
| 2,441,598 | 5/1948 | Robertson | 332/43 B |
| 2,514,679 | 7/1950 | Southworth | 455/328 |
| 4,032,850 | 6/1977 | Hill | 455/326 |
| 4,306,311 | 12/1981 | Igarashi | 455/330 |
| 4,380,829 | 4/1983 | Stevenson et al. | 455/330 |

Primary Examiner—Robert L. Griffin
Assistant Examiner—Elissa Seidenglanz
Attorney, Agent, or Firm—Limbach, Limbach & Sutton

[57] ABSTRACT

A double-balanced waveguide mixer is disclosed that utilizes a quad-ridge waveguide and a quad-diode ring. In a down-converter version of the mixer, the input signal is applied to one pair of opposed ridges of the quad-ridge waveguide and the local oscillator signal is applied to the other pair of opposed ridges. The diode ring is coupled through capacitors to one pair of opposed ridges, and is directly connected to the other pair of opposed ridges. The intermediate frequency is tapped off at the junction between the capacitors and the diode ring.

21 Claims, 11 Drawing Figures

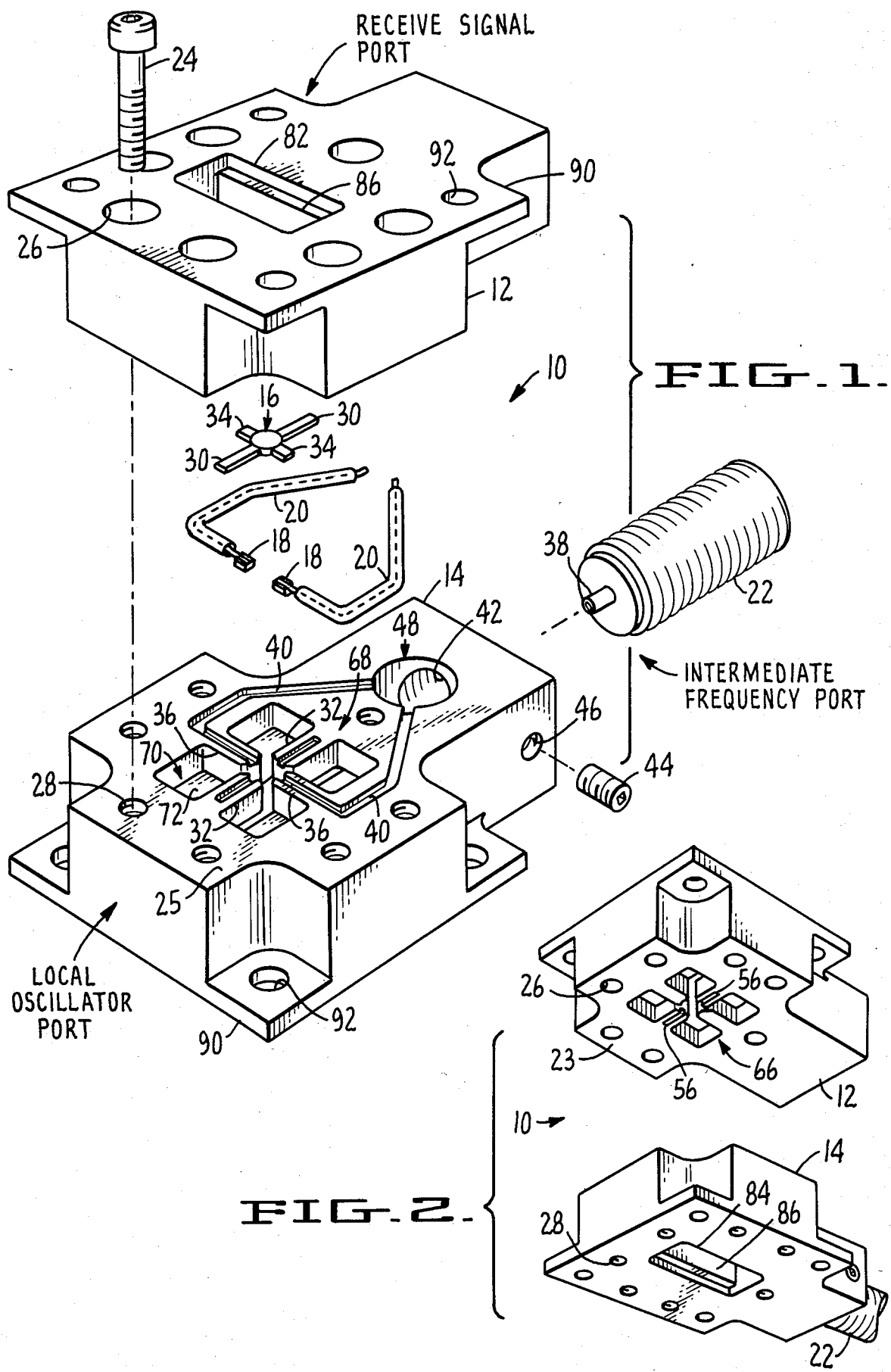

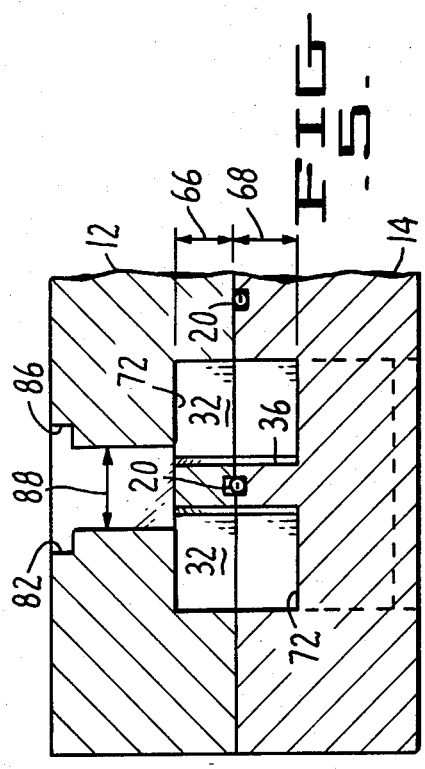
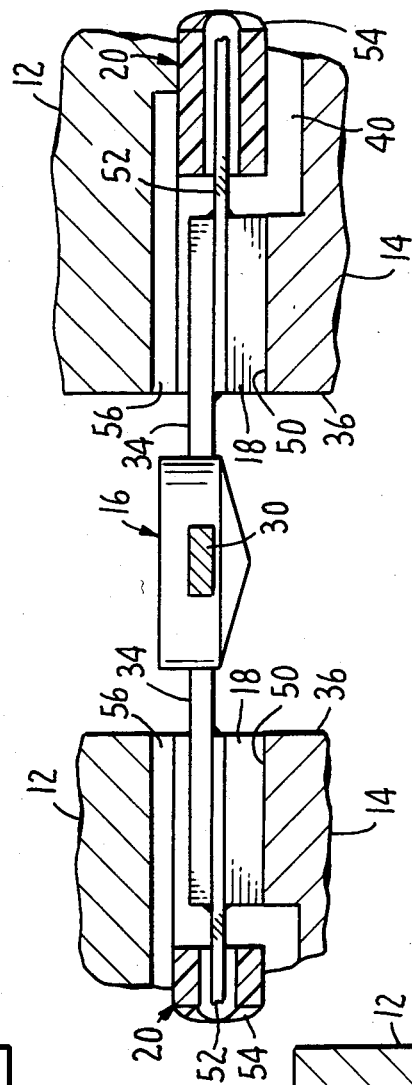
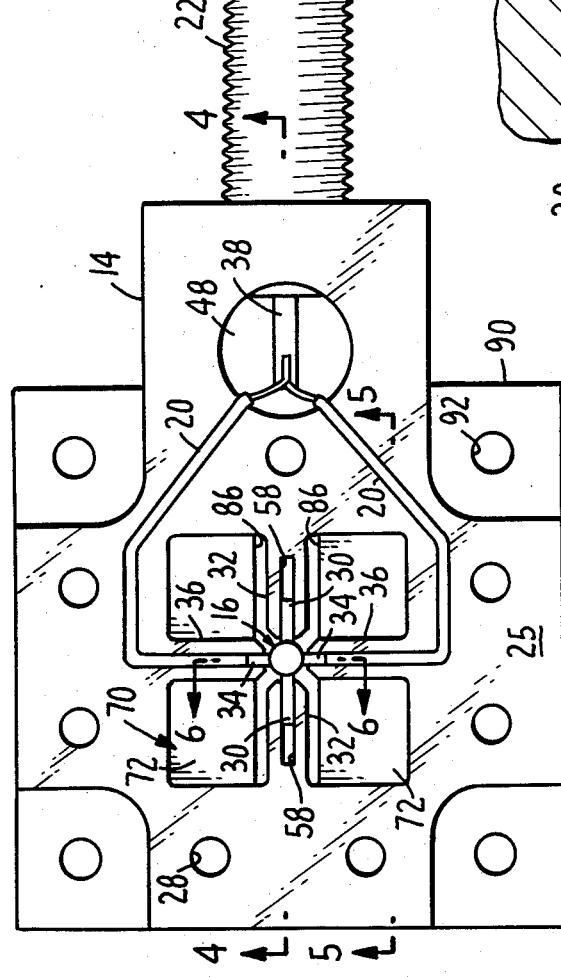
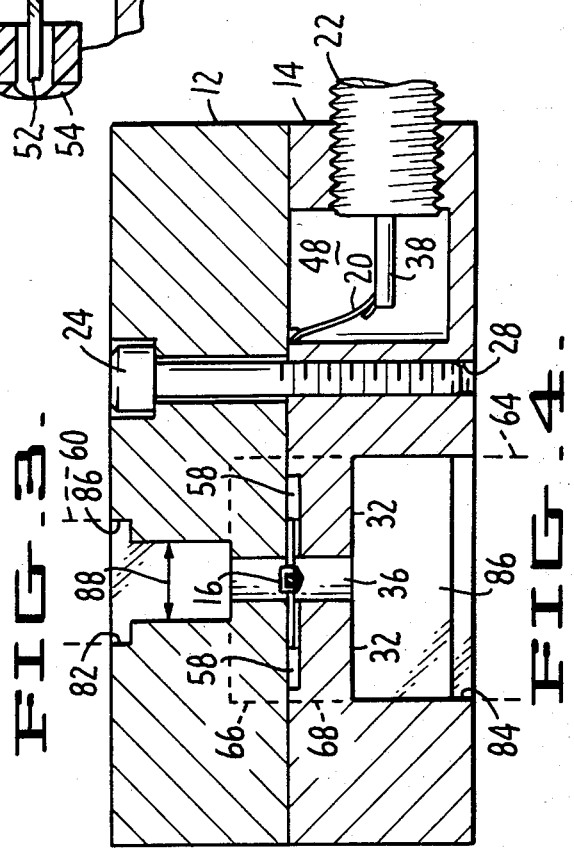

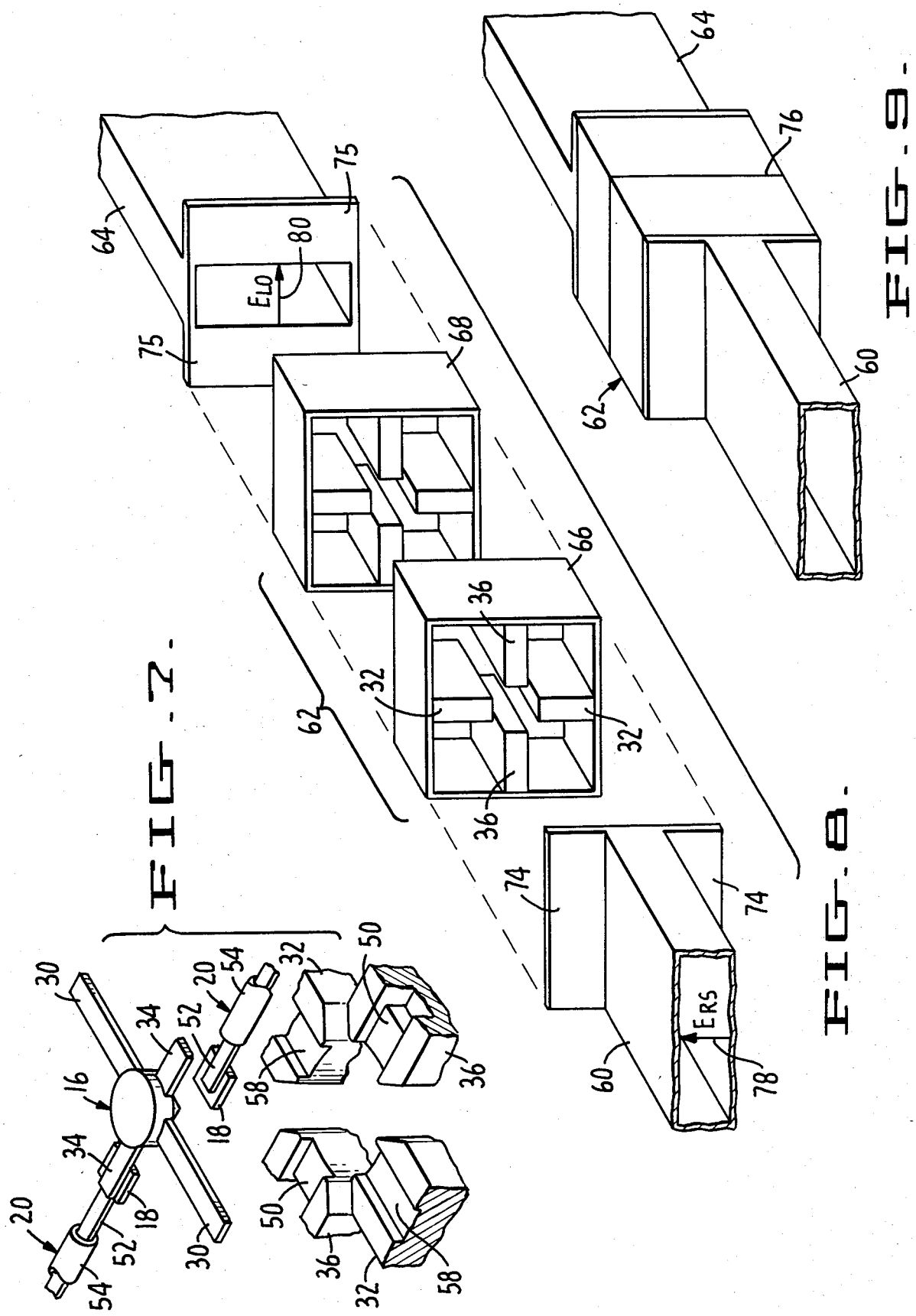

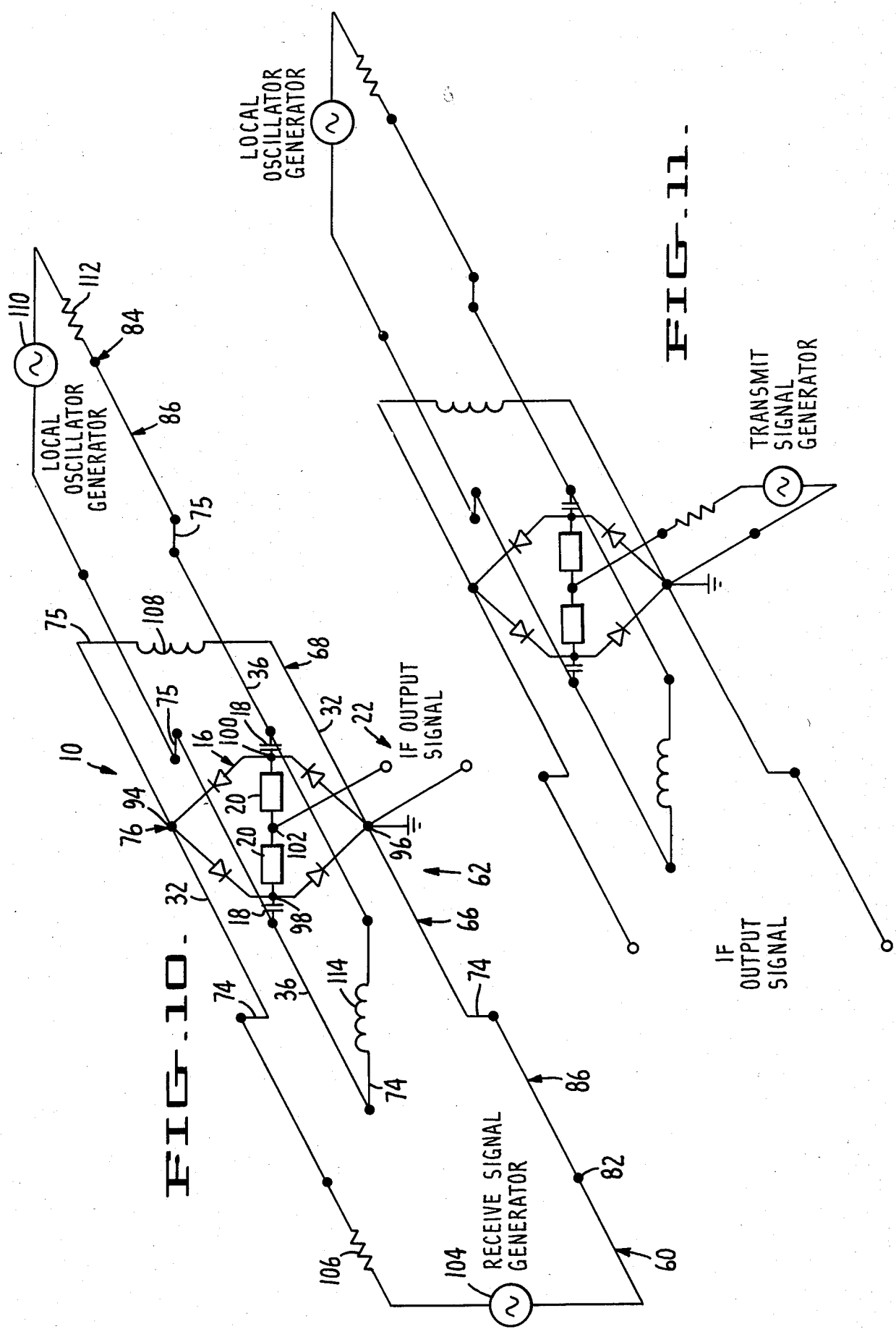

QUAD-RIDGE WAVEGUIDE MIXER

BACKGROUND OF THE INVENTION

1. Field of the Invention

This invention relates generally to frequency converters and mixers, and relates more particularly to a double-balanced waveguide mixer that utilizes a quad-ridge waveguide and a quad-diode ring.

2. Description of the Relevant Art

A mixer is a non-linear device that converts a low-power signal from one frequency to another by combining it with a high-power signal. Typically, mixers are used to up-convert broadcast signals to higher frequencies for transmission or to down-convert received signals to lower freqencies for signal processing. A mixer receives two input signals, the low-power receive signal (RS) and the high-power local oscillator signal (LO), and produces one output signal, an intermediate frequency signal (IF). The component most prominent in the output signal of a mixer is the product of the two input signals. Assuming that the input signals are sinusoidal functions of time, the output signal will also be a sinusoidal time signal having frequency components at the sum and at the difference of the input signal frequencies. Sums and differences of multiples of the input signal frequencies are also present in the output signal. The component having a frequency equal to the sum of the input signal frequencies is called the upper-sideband signal, while the component having a frequency equal to the difference of the input signal frequencies is called the lower-sideband signal. Usually only one of these frequencies is desired; the other is filtered out in some manner.

Mixers typically utilize diodes to combine the two input signals and generate the output signal. Among the different mixer configurations are single-balanced mixers, which utilize two diodes, and double-balanced mixers, which utilize four diodes. In a double-balanced mixer, the four diodes are configured in a ring structure having four junctions, with each diode coupled between two of the four junctions and with each junctions connecting the anode of one diode to the cathode of an adjacent diode. The receive signal is applied to two opposed junctions of the diode ring, while the local oscillator signal is applied to the other two opposed junctions of the diode ring. In such a mixer, the intermediate frequency signal is conventionally formed by summing the currents at two opposed junctions through the receive signal transformer. Double-balanced mixers have the property of cancelling some of the unwanted harmonics that would otherwise be present in the intermediate frequency signal.

In high frequency communication systems that handle broadcast signals in the K-band, which ranges from about ten to about thirty-five gigahertz (GHz), waveguide transmission lines are typically used to convey signals. Since waveguide mixers have conventionally been difficult to implement, K-band mixers are often implemented using microstrip techniques. In order to use such K-band mixers, the input signals are transferred from waveguides to microstrip lines that feed a single-balanced microstrip or stripline mixer, and the output signal is then retransferred from a microstrip line to a waveguide. This is not a satisfactory solution because of the inefficiencies involved in converting between waveguides and microstrip transmission lines and because of the high cost of building a K-band microstrip or stripline mixer.

Double-balanced K-band mixers have been heretofore unknown due to the difficulties of supplying two input signals having separate grounds to and removing a third signal from the planar structure of the quad-diode ring, and due to fact that the use of transformers to define the intermediate frequency signal is impractical at such frequencies.

SUMMARY OF THE INVENTION

In accordance with the illustrated preferred embodiment, the present invention provides a double-balanced waveguide mixer that utilizes a quad-ridge waveguide and a quad-diode ring. The mixer responds to an input signal and a local oscillator signal to generate an intermediate frequency signal equal to the product of the input and local oscillator signals. The mixer includes (1) a quad-ridge waveguide, (2) two capacitors, (3) a diode ring, and (4) summing means. The quad-ridge waveguide has four ridges that protrude inwardly from the sides thereof. In a down-converter version of the present invention, the input signal is applied through an input signal port to one pair of opposed ridges and the local oscillator signal is applied to the other pair of opposed ridges. The diode ring includes four diodes interconnected in a ring structure with a first pair of opposed junctions of the diode ring coupled through the capacitors to one pair of opposed ridges, and with a second pair of opposed junctions coupled to the other pair of opposed ridges. The summing means is coupled across the first pair of opposed junctions of the diode ring, and sums the currents at those junctions to provide the intermediate frequency signal at an intermediate frequency port. In an up-converter version of the present invention, the input signal port and the intermediate frequency port are interchanged.

Preferably, the quad-ridge waveguide has a square shape and is constructed in two equal length sections with the diode ring positioned at the junction between the two sections. The lengths of the two sections of quad-ridge waveguide are preferably matched to a quarter wavelength of the receive signal. In the down-converter version, the receive signal and local oscillator signal are preferably supplied to opposite ends of the quad-ridge waveguide through rectangular waveguides oriented at ninety degrees to each other. Since the impedance of the quad-ridge waveguide with the attached diode ring is different from the impedance of the rectangular waveguides, a transition section of rectangular waveguide of a smaller height is provided at each end between the quad-ridge and rectangular waveguides. The summing means is preferably provided by two transmission lines that extend from the diode ring to the center conductor of a coaxial transmission line. The coaxial transmission line has its shield grounded to the housing of the quad-ridge waveguide.

Down-converter mixers constructed according to the present invention exhibit several advantageous features. One feature is the orthogonal orientation of the local oscillator and receive signal ports, which provides good isolation between the ports. Another feature is the excellent isolation between the local oscillator and intermediate frequency ports provided by the capacitors. Another feature is that the quad-ridge waveguide makes it possible to couple power from the local oscillator and receive signal ports to the appropriate terminals of the diode ring, thereby providing a double balanced mixer.

Mixers constructed according to the present invention have several advantages when compared to prior art mixers. One advantage is that the mixer of the present invention is a waveguide mixer, so that a waveguide communications system can be implemented without the need to transfer the receive and local oscillator signals to microstrip transmission lines in order to interface to a microstrip mixer. Another advantage is that the waveguide mixer of the present invention is double balanced, which provides a cleaner output signals that prior art single balanced mixers. Another advantage of the down-converter version of the mixer is that the upper sideband of the intermediate frequency signal is filtered out by the mixer itself so that a separate filter is not necessary for that purpose. Low cost is another advantage of mixers designed and constructed according to the present invention.

The features and advantages described in the specification are not all inclusive, and particularly, many additional features and advantages will be apparent to one of ordinary skill in the art in view of the drawings, specification and claims hereof. Moreover, it should be noted that the language used in the specification has been principally selected for readability and instructional purposes, and may not have been selected to delineate or circumscribe the inventive subject matter, resort to the claims being necessary to determine such inventive subject matter.

BRIEF DESCRIPTION OF THE DRAWINGS

FIG. 1 is an exploded perspective view from the top of a quad-ridge waveguide mixer according to the present invention.

FIG. 2 is an exploded perspective view from the bottom of the quad-ridge waveguide mixer of FIG. 1.

FIG. 3 is a top plan view of a lower housing of the quad-ridge waveguide mixer of FIG. 1.

FIG. 4 is a sectional view through the center of the quad-ridge waveguide mixer, and is taken along section lines 4—4 of FIG. 3.

FIG. 5 is a sectional view of the quad-ridge waveguide mixer, and is taken along section lines 5—5 of FIG. 3.

FIG. 6 is a sectional detail view of the quad-ridge waveguide mixer, and is taken along section lines 6—6 of FIG. 3.

FIG. 7 is an exploded perspective view from the top of a quad-diode package and two capacitors of the quad-ridge waveguide mixer.

FIG. 8 is an exploded perspective view of a schematic representation of the quad-ridge waveguide mixer.

FIG. 9 is a perspective view of the assembled quad-ridge waveguide mixer of FIG. 8.

FIG. 10 is a schematic diagram of the down-converter version of the quad-ridge waveguide mixer of the present invention.

FIG. 11 is a schematic diagram of the up-converter version of the quad-ridge waveguide mixer of the present invention.

DETAILED DESCRIPTION OF THE PREFERRED EMBODIMENT

FIGS. 1 through 11 of the drawings depict various preferred embodiments of the present invention for purposes of illustration only. One skilled in the art will readily recognize from the following discussion that alternative embodiments of the structures and methods illustrated herein may be employed without departing from the principles of the invention described herein.

The preferred embodiment of the present invention is a double-balanced waveguide mixer that utilizes a quad-ridge waveguide and a quad-diode ring. As shown in exploded views in FIGS. 1 and 2 and in a top plan view in FIG. 3, a quad-ridge waveguide mixer 10 according to the present invention includes an upper housing 12, a lower housing 14, a quad-diode ring 16, two capacitors 18, two transmission lines 20, and a coaxial connector 22. The mixer 10 will be described immediately below using nomenclature that assumes use as a down-converter, although the same structure can be used as an up-converter by switching the receive signal and intermediate frequency ports. Such an up-converter is described below in conjunction with FIG. 11.

When the mixer 10 is assembled, the faces 23 and 25 of the upper and lower housings 12 and 14 are brought into contact and secured by several screws 24 that fit into clearance holes 26 in the upper housing 12 and are threaded into tapped holes 28 in the lower housing 14. Also when assembled, two leads 30 of the diode ring 16 are electrically connected to two opposed ridges 32 of the lower housing 14, and the other two leads 34 of the diode ring are electrically connected through the capacitors 18 to the other two opposed ridges 36 of the lower housing. The two transmission lines 20 are electrically connected to the junctions between the capacitors 18 and the second pair of leads 34 of the diode ring 16 at one end, and are electrically connected to the center conductor 38 of the coaxial connector 22 at the other end thereof. In between the diode ring 16 and the coaxial connector 22, the transmission lines 20 are routed through two channels 40 that are cut into the face 25 of the lower housing 14. The coaxial connector 22 is threaded into a tapped hole 42 in the side of the lower housing 14 and is held in place by a set screw 44 that is threaded into another tapped hole 46. As best shown in FIGS. 3 and 4, the center conductor 38 of the coaxial connector 22 protrudes into a cavity 48 in the lower housing 14, where the transmission lines 20 are connected to the center conductor.

In reference now to FIGS. 3, 6, and 7, the interconnections among the diode ring 16, the capacitors 18, the transmission lines 20, and the lower housing 14 are shown. Each one of the capacitors 18 rests on and is electrically connected to a pad 50 in ridge 36 of the lower housing 14. Preferably, each capacitor 18 is a chip capacitor having electrical contacts or terminals on the top and bottom of its package. The pad 50 serves to locate the position of its associated capacitor 18 for ease of assembly. The bottom contact or terminal of the capacitor 18 is preferably bonded to the pad 50 using an electrically conductive adhesive such as silver epoxy. A conductive wire 52 of the transmission line 20 is electrically connected to the top contact or terminal of each capacitor 18. The wire 52 is preferably a gold ribbon, and is preferably gap welded to the top of its associated capacitor 18. The wire 52 is insulated by a tube 54, which is preferably composed of Teflon. The transmission lines 20 are each routed through the channel 40 to the cavity 48 near the coaxial connector 22, where the wire 52 of each transmission line is attached to the center conductor 38 of the connector. Two of the leads 34 of the diode ring 16 are electrically connected to the top of the wire 52, preferably by bonding with silver epoxy. As shown in FIG. 6, the lower surface of the upper housing 12 is relieved at 56 to provide clearance above the leads 34. As shown in FIGS. 3 and 7, the other two leads 30 of the diode ring 16 are electrically connected to the ridges 32 of the lower housing 14. The leads 30 are placed in grooves 58 in the ridges 32 and are connected preferably by bonding with silver epoxy.

The waveguide structure of the mixer 10 is best shown in FIGS. 8 and 9. A first rectangular waveguide 60 supplies the receive signal to one end of the quad-ridge waveguide 62 of the mixer, while a second rectangular waveguide 64 supplies the local oscillator signal to the other end of the quad-ridge waveguide. Note that the two rectangular waveguides 60 and 64 are oriented orthogonally to each other, and each is aligned with a pair of opposed ridges 32 or 36, The quad-ridge waveguide 62 is composed of two sections 66 and 68. As shown in FIGS. 4 and 5, section 66 of the quad-ridge waveguide is defined by the upper housing 12 and section 68 is defined by the lower housing 14, The sections 66 and 68 of the quad-ridge waveguide 62 are preferably fabricated by milling four pockets 70 into the faces 23 and 25 of the upper and lower housings 12 and 14, with the pockets having a depth equal to the length of the section 66 or 68, Between each two pockets 70 is a ridge formed by material remaining after the milling operation. The bottom surface 72 of the pockets 70 defines the ends 74 and 75 of the quad-ridge waveguide 62. The housings are fabricated from a conductive material such as aluminum.

As described above, the diode ring 16, capacitors 18, and transmission lines 20 are coupled to the ridges 32 and 36 of the lower housing 14, so that when the housings are assembled, the diodes and capacitors are positioned at the interface plane 76 (see FIG. 9) between the two housings. When the housings are assembled, the ridges 32 and 36 of section 66 are aligned and in contact with the corresponding ridges of section 68 so that the combined sections 66 and 68 act as a single quad-ridge waveguide.

The electric field 78 (see FIG. 8) of the receive signal, which is oriented across the height of the first rectangular waveguide 60, is supplied to and is carried by the opposed ridges 32 within the quad-ridge waveguide section 62. Likewise, the electric field 80 of the local oscillator signal, which is oriented across the height of the second rectangular waveguide 64, is supplied to and is carried by the opposed ridges 36 within the quad-ridge waveguide section 62. As will be explained in detail below, the receive signal carried by the ridges 32 is supplied to two opposed leads 30 of the diode ring 16, while the local oscillator signal carried by the ridges 36 is coupled through the capacitors 18 and into the other two opposed leads 34 of the diode ring.

As shown in FIGS. 1, 2, and 3, the receive signal is supplied to a receive port 82 located at the upper surface of the upper housing 12. The local oscillator signal is supplied to a local oscillator port 84 located at the bottom surface of the lower housing 14 and oriented orthogonally with respect to the receive port 82. The two ports 82 and 84 preferably are dimensioned the same as the two rectangular waveguides 60 and 64. Since the impedance of the quad-ridge waveguide 62 with the installed diode ring is different from that of the rectangular waveguides 60 and 64, a transition section 86 is provided at each end of the quad-ridge waveguide, Each transition section 86 is a rectangular waveguide oriented in the same direction as the incoming signal waveguide but with a somewhat narrower height 88. The depth of each transition section 86 is matched to a quarter wavelength of its incoming signal. The transition sections effectively serve as matching networks to match the impedance of the mixer to that of its input components. A flange 90 with four mounting holes 92 is provided at each end of the mixer 10 for attaching the two rectangular waveguides to the ports 82 and 84 of the mixer.

The circuit of the mixer 10, illustrated in FIG. 10, includes the quad-ridge waveguide 62, the diode ring 16, the two capacitors 18, the two transmission lines 20, and the two transition waveguide sections 86. The quad-ridge waveguide 62 includes two pairs of opposed ridges 32 and 36 that extend from one end 74 of the quad-ridge waveguide to the other end 75. The diode ring 16 and capacitors 18 are coupled to the ridges 32 and 36 at the interface plane 76 formed between the two housings 12 and 14. One junction 94 of the diode ring 16 is connected to one ridge 32, while the opposite junction 96 of the diode ring is connected to the opposite ridge 32. Junctions 94 and 96 correspond to leads 30 of the diode package 16. Another junction 98 of the diode ring is connected to the wire 52 of one transmission line 20 and to one terminal of a capacitor 18, while the opposite junction 100 of the diode ring is connected to the wire of the other transmission line and to one terminal of the other capacitor. The other terminals of the capacitors are connected to opposite ridges 36. Junctions 98 and 100 correspond to leads 34 of the diode package 16. Preferably, the capacitors have a value of less than five picofarads, with 3 picofarads as a preferred value for operation with receive and local oscillator signals in the nineteen to twenty-four GHz range. Also preferably, the diodes of the diode ring 16 are Schottky barrier diodes, which can be obtained in a ring configuration from Metallics Corporation of Sunnyvale, Calif. The transmission lines 20 are joined at 102 to the central conductor of the coaxial connector 22, while the shield of the coaxial connector is grounded to the housing.

A receive signal is generated by a receive signal generator 104, which has an impedance 106, and is supplied to the receive port 82 via the first rectangular waveguide 60. The receive signal then enters the transition section 86, which has a length matched to a quarter wavelength of the receive signal. The receive signal then enters the quad-ridge waveguide 62 on the opposed ridges 32. At the end 75 of the pad-ridge waveguide 62, there is an inductive short circuit 108 across the ridges 32 due to the orthogonal orientation of the local oscillator waveguide 64 and transition section 86. In other words, the local oscillator waveguide can not support a waveguide mode with the electric field across the wide dimension of the waveguide, so that the receive signal does not propagate down the local oscillator waveguide. The length of section 68 of the quad-ridge waveguide 62, which extends from the plane 76 of the diode ring 16 to the end 75, is matched to a quarter wavelength of the receive signal so that the inductive short circuit 108 appears at the plane of the diode ring as an open circuit.

Similarly, a local oscillator signal ia generated by a local oscillator signal generator 110, which has an impedance 112, and is supplied to the local oscillator port 84 via the second rectangular waveguide 64. The local oscillator signal then enters the transition section 86, which has a length matched to a quarter wavelength of the local oscillator signal. The local oscillator signal then enters the quad-ridge waveguide 62 on the opposed ridges 36. At the end 74 of the quad-ridge waveguide 62, there is an inductive short circuit 114 across the ridges 36 due to the orthogonal orientation of the receive waveguide 60 and transition section 86. The length of section 66 of the quad-ridge waveguide 62, which extends from the plane 76 of the diode ring 16 to the end 74, is matched to a quarter wavelength of the local oscillator signal so that the inductive short circuit 114 appears at the plane of the diode ring as an open circuit. Due to the orthogonal orientation of the receive signal waveguide 60, the local oscillator signal does not propagate past the end 74 of the quad-ridge waveguide 62. If the frequencies of the receive and local oscillator signals are fairly close, then the length of section 66 can equal that of section 68 for ease of fabrication. The term 'matched to a quarter wavelength' is known in the art to mean that the effective circuit provides a length equivalent to a quarter wavelength, but that due to factors such as stray reactances, the length of the waveguide may not actually equal a quarter wavelength of the signal.

At the high frequencies of the receive and local oscillator signals, in excess of perhaps 6 to 8 GHz, the bypass capacitors present a low impedance, so that the local oscillator signal is freely coupled into the diode bridge. At the lower sideband component of the intermediate frequency signal, which is preferably in the region of hundreds of megahertz, the capacitors have a high impedance. The high frequency receive and local oscillator signals and the upper sideband component of the intermediate frequency signal, which has a frequency equal to the sum of the two input signals, are thus filtered off from the intermediate frequency port through the capacitors 18.

Although the above description has described the preferred embodiment of the mixer 10 in detail, there are other ways of implementing the mixer of the present invention. For example, the two input ports can be interchanged, with the local oscillator signal supplied directly to the diode ring 16 through port 82 and the receive signal supplied to the diode ring through port 84 and the capacitors 18. In such case, the mixer 10 would continue to function, although with a decreased isolation between the local oscillator signal and the intermediate frequency signal. Also, other circuit elements with some capacitance, such as a transmission line, could be substituted for the chip capacitors 18. Also, the local oscillator and receive signals could be supplied to the quad-ridge waveguide by means other than rectangular waveguides such as coaxial connectors. Also, a matching network equivalent to the rectangular transition sections 86 could be constructed using a variety of obstacles in the waveguide.

An up-converter version of the mixer of the present invention is illustrated in FIG. 11. The structure of the up-converter mixer 120 is identical to the structure of the down-converter mixer 10 described above. The only difference is in the designation of the input and output ports. The local oscillator signal is supplied to the same port 84, as described above. The other input signal, a transmit signal, is supplied to the coaxial connector 22, which in the down-converter mixer 10 is the output port for the intermediate frequency signal. The up-converted output signal of mixer 120 is generated at port 82, which in the down-converter mixer 10 is the input port for the receive signal. Preferably, the transmit signal has a frequency on the order of hundreds of megahertz, while the local oscillator and intermediate frequency signals have frequencies in the K-band range.

From the above description, it will be apparent that the invention disclosed herein provides a novel and advantageous double-balanced waveguide mixer that utilizes a quad-ridge waveguide and a quad-diode ring. The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

What is claimed is:

1. A mixer responsive to a receive signal and a local oscillator signal for generating an intermediate frequency signal equal to a product of the receive and local oscillator signals, said mixer comprising:
    a quad-ridge waveguide having four ridges protruding inwardly from the walls thereof, wherein the receive signal is applied to one pair of opposed ridges and the local oscillator signal is applied to the other pair of opposed ridges;
    two capacitors each coupled at one terminal thereof to a separate ridge of a first pair of opposed ridges;
    a diode ring including four diodes interconnected as a ring with each diode coupled between two of four junctions of said ring and with each junction connecting the anode of one diode to the cathode of an adjacent diode, wherein a first pair of opposed junctions of said diode ring is coupled through said capacitors to said first pair of opposed ridges, and wherein a second pair of opposed junctions of said diode ring is coupled to a second pair of opposed ridges; and
    summing means coupled to said first pair of opposed junctions of said diode ring for providing the intermediate frequency signal.

2. A mixer as recited in claim 1 wherein said quad-ridge waveguide comprises a square waveguide with each of said ridges protruding inwardly from the center of one side of the square waveguide.

3. A mixer as recited in claim 1 wherein said diode ring is coupled to said quad-ridge waveguide at a plane intermediate between the two ends of said quad-ridge waveguide, wherein said plane is orthogonal to the length of said quad-ridge waveguide.

4. A mixer as recited in claim 3 wherein the length of said quad-ridge waveguide between one end of said waveguide and the plane of said diode ring has a length that is matched to a quarter wavelength of the receive signal, and wherein the length of said quad-ridge waveguide between the plane of said diode ring and the other end of said quad-ridge waveguide also has a length that is matched to a quarter wavelength of the local oscillator signal.

5. A mixer as recited in claim 4 wherein each end of said quad-ridge waveguide is terminated in a short circuit.

6. A mixer as recited in claim 1 wherein the receive signal is applied at one end of said quad-ridge waveguide via a first rectangular waveguide that is aligned with two opposed ridges, and wherein the local oscillator signal is applied at the other end of said quad-ridge waveguide via a second rectangular waveguide that is aligned with the other two opposed ridges.

7. A mixer as recited in claim 6 wherein the local oscillator signal is applied to said first pair of opposed ridges of said quad-ridge waveguide, and wherein the receive signal is applied to said second pair of opposed ridges of said quad-ridge waveguide.

8. A mixer as recited in claim 6 further comprising first matching means disposed between said first rectangular waveguide and said quad-ridge waveguide and operable for matching an impedance of said first rectangular waveguide to an impedance of said quad-ridge waveguide.

9. A mixer as recited in claim 8 wherein said first matching means includes a first matching section of rectangular waveguide having a height less than the height of said first rectangular waveguide, and having an impedance intermediate to the impedance of said first rectangular waveguide and the impedance of said quad-ridge waveguide.

10. A mixer as recited in claim 9 wherein the length of said first matching section is matched to a quarter wavelength of the receive signal.

11. A mixer as recited in claim 6 further comprising second matching means disposed between said second rectangular waveguide and said quad-ridge waveguide and operable for matching an impedance of said second rectangular waveguide to an impedance of said quad-ridge waveguide.

12. A mixer as recited in claim 11 wherein said second matching means includes a second matching section of rectangular waveguide having a height less than the height of said second rectangular waveguide, and having an impedance intermediate to the impedance of said second rectangular waveguide and the impedance of said quad-ridge waveguide.

13. A mixer as recited in claim 12 wherein the length of said second matching section is matched to a quarter wavelength of the local oscillator signal.

14. A mixer as recited in claim 1 wherein said capacitors are selected to present a high impedance to a lower sideband component of the intermediate frequency signal and a low impedance to an upper sideband component of the intermediate frequency signal and to the receive and local oscillator signals.

15. A mixer as recited in claim 1 wherein each capacitor is a chip capacitor having a capacitance of less than about five picofarads.

16. A mixer as recited in claim 1 wherein said summing means includes two transmission lines each electrically connected at one end thereof to separate junctions of said first pair of opposed junctions of said diode ring and both electrically connected in common at the other ends thereof to a conductor of a third transmission line, and wherein the ground of said third transmission line is electrically connected to said quad-ridge waveguide.

17. A mixer as recited in claim 1 wherein said summing means includes two transmission lines each coupled at one end thereof to separate junctions of said first pair of opposed junctions of said diode ring and both coupled at the other ends thereof to a center conductor of a coaxial transmission line, and wherein a shield of said coaxial transmission line is coupled to said quad-ridge waveguide.

18. A double-balanced waveguide mixer responsive to a receive signal and a local oscillator signal for generating an intermediate frequency signal equal to a product of the receive and local oscillator signals, said mixer comprising:

a quad-ridge waveguide having four ridges protruding inwardly from the four sides thereof, wherein said quad-ridge waveguide includes two abutting sections one having a length matched to a quarter wavelength of the receive signal and the other having a length matched to a quarter wavelength of the local oscillator signal;

a first matching section coupled to one end of said quad-ridge waveguide and aligned with two opposed ridges, wherein the receive signal is supplied to one pair of opposed ridges of said quad-ridge waveguide through a first rectangular waveguide and said first matching section, wherein said first matching section includes a rectangular waveguide having a height less than the height of said first rectangular waveguide, having a length that is matched to a quarter wavelength of the receive signal, and having an impedance intermediate to an impedance of said first rectangular waveguide and an impedance of said quad-ridge waveguide;

a second matching section coupled to the other end of said quad-ridge waveguide and aligned with the other pair of opposed ridges, wherein the local oscillator signal is supplied to the other pair of opposed ridges of said quad-ridge waveguide through a second rectangular waveguide and said second matching section, wherein said second matching section includes a rectangular waveguide having a height less than the height of said second rectangular waveguide, having a length that is matched to a quarter wavelength of the local oscillator signal, and having an impedance intermediate to the impedance of said second rectangular waveguide and the impedance of said quad-ridge waveguide;

two capacitors each coupled at one terminal thereof to a separate ridge of the pair of opposed ridges that carry the local oscillator signal;

a diode ring coupled to said quad-ridge waveguide at the interface between the two abutting sections of said quad-ridge waveguide, wherein said diode ring includes four diodes interconnected as a ring with each diode coupled between two of four junctions of said diode ring and with each junction connecting the anode of one diode to the cathode of an adjacent diode, wherein two opposed junctions of said diode ring are electrically connected to a separate ridge of the pair of opposed ridges that carry the receive signal, and wherein each of the other two opposed junctions of said diode ring is electrically coupled through one of said capacitors to a separate ridge of the pair of opposed ridges that carry the local oscillator signal; and two transmission lines each coupled at one end thereof to a terminal of a separate capacitor and to a separate one of said opposed junctions of said diode ring, wherein both transmission lines are coupled at the other ends thereof to a center conductor of a coaxial transmission line, and wherein a shield of said coaxial transmission line is coupled to said quad-ridge waveguide.

19. A mixer responsive to a receive signal and a local oscillator signal for generating an intermediate frequency signal equal to a product of the receive and local oscillator signals, said mixer comprising:

a quad-ridge waveguide having four ridges protruding inwardly from the walls thereof, wherein the receive signal and the local oscillator signal are conducted by said ridges;

two capacitors each coupled at one terminal thereof to a separate ridge of a pair of opposed ridges;

four interconnected diodes coupled between said ridges, wherein said diodes are coupled through said capacitors to said pair of opposed ridges; and means coupled to said diodes for providing the intermediate frequency signal.

20. A double-balanced mixer responsive to a receive signal and a local oscillator signal for generating an intermediate frequency signal equal to a lower sideband component of a product of the receive and local oscillator signals, said mixer comprising:

a square quad-ridge waveguide each having four ridges protruding inwardly from the four sides thereof, wherein said quad-ridge waveguide includes two aligned sections extending in opposite directions from an active plane at the center of said quad-ridge waveguide, wherein a first section has a length matched to a quarter wavelength of the receive signal and a second section has a length matched to a quarter wavelength of the local oscillator signal, and wherein the receive signal is supplied at an end of said second section of said quad-ridge waveguide to a pair of opposed ridges and the local oscillator signal is supplied at an end of said first section of said quad-ridge waveguide to the other pair of opposed ridges; two capacitors each coupled at one terminal thereof to a separate ridge of a first pair of opposed ridges;

a quad ring of Schottky diodes coupled to said quad-ridge waveguide at said active plane, wherein a first pair of opposed junctions of said diode ring is coupled through said capacitors to the first pair of opposed ridges, and wherein a second pair of opposed junctions of said diode ring is coupled to a second pair of opposed ridges; and filter means coupled to said diodes and said quad-ridge waveguide for separating the lower sideband of the intermediate frequency signal from the receive and local oscillator signals.

21. A mixer responsive to a transmit signal and a local oscillator signal for up-converting the transmit signal to an intermediate frequency signal equal to the product of the transmit and local oscillator signals, said mixer comprising:

a quad-ridge waveguide having four ridges protruding inwardly from the walls thereof, wherein the local oscillator signal is supplied to one pair of opposed ridges and the intermediate frequency signal is available at the other pair of opposed ridges;

two capacitors each coupled at one terminal thereof to a separate ridge of a first pair of opposed ridges;

a diode ring including four diodes interconnected as a ring with each diode coupled between two of four junctions of said ring and with each junction connecting the anode of one diode to the cathode of an adjacent diode, wherein a first pair of opposed junctions of said diode ring is coupled through said capacitors to said first pair of opposed ridges, and wherein a second pair of opposed junctions of said diode ring is coupled to a second pair of opposed ridges; and means for supplying the transmit signal to said first pair of opposed junctions of said diode ring,

* * * * *